(12) United States Patent
Ronemus

(10) Patent No.: US 9,697,984 B2
(45) Date of Patent: Jul. 4, 2017

(54) CHARGED PARTICLE FILTER

(71) Applicant: THERMO ELECTRON SCIENTIFIC INSTRUMENTS LLC, Madison, WI (US)

(72) Inventor: Alan Ronemus, Oregon, WI (US)

(73) Assignee: Thermo Electron Scientific Instruments LLC, Madison, WI (US)

( * ) Notice: Subject to any disclaimer, the term of this patent is extended or adjusted under 35 U.S.C. 154(b) by 0 days.

(21) Appl. No.: 14/925,204

(22) Filed: Oct. 28, 2015

(65) Prior Publication Data

US 2017/0125201 A1    May 4, 2017

(51) Int. Cl.
    *H01J 37/09* (2006.01)
    *H01J 37/244* (2006.01)
    *H01J 37/28* (2006.01)

(52) U.S. Cl.
    CPC ............ *H01J 37/09* (2013.01); *H01J 37/244* (2013.01); *H01J 37/28* (2013.01)

(58) Field of Classification Search
    CPC ........... H01J 37/09; H01J 37/244; H01J 37/28
    USPC ............ 250/396 R, 396 ML, 423 R, 423 ML
    See application file for complete search history.

(56) References Cited

U.S. PATENT DOCUMENTS

| 3,629,578 | A  |    12/1971 | Le Poole |
| 4,382,183 | A  |     5/1983 | Kimura |
| 5,831,270 | A  |    11/1998 | Nakasuji |
| 6,403,967 | B1 |     6/2002 | Chen et al. |
| 6,680,663 | B1* |    1/2004 | Lee ...................... G01R 33/383 335/302 |
| 8,049,182 | B2* |   11/2011 | Bewick ................... H01J 37/09 250/396 ML |
| 8,530,835 | B2 |     9/2013 | Funnemann |
| 2005/0275835 | A1 | 12/2005 | Sogard |

FOREIGN PATENT DOCUMENTS

| JP | 57128088 | 8/1982 |
| JP | 62272434 | 11/1987 |
| WO | WO2009112416 A1 | 9/2009 |

* cited by examiner

*Primary Examiner* — Michael Maskell
(74) *Attorney, Agent, or Firm* — William R. McCarthy, III

(57) ABSTRACT

A charged particle filter includes a magnetic deflector having a bore along an axis thereof passing through the magnetic deflector from a sample end to a detector end of the magnetic deflector, and through which bore charged particles pass when in use, the magnetic deflector being formed from two magnets positioned around the bore, with a gap between the two magnets, the two magnets each having a linear central section and two ends, each end forming a curved surface, the curved surface having an aspect ratio defined by a height in a range of between one tenth and ten times the gap between the two magnets, and a width in a range of between one tenth and ten times the gap.

30 Claims, 17 Drawing Sheets

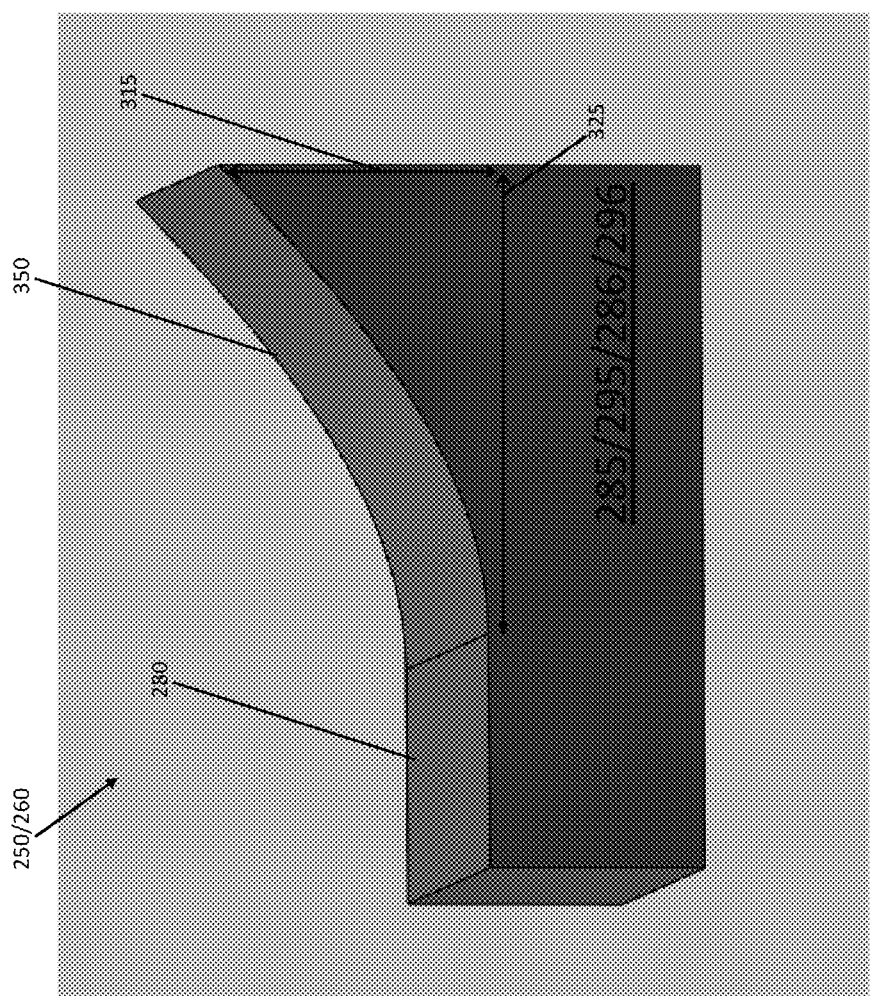

CHARGED PARTICLE FILTER

FIELD OF THE INVENTION

The invention is generally related to a charged particle filter, particularly for use in association with a particle detector in a microanalysis system.

BACKGROUND

As described in U.S. Pat. No. 8,049,182 issued to Bewick on Nov. 1, 2011, (hereinafter "Bewick") hereby incorporated by reference in its entirety (however, where anything in the incorporated reference contradicts anything stated in the present application, the present application prevails) with reference to FIG. 1, for X-ray analysis in an electron microscope (EM) 100, an X-ray spectrum is measured by sensing and measuring the energies of individual X-ray photons emitted by a sample 101 when it is hit by a focused electron beam 102. Each X-ray photon is an energetic particle and the energy is typically converted into charge using an X-ray detector 105. Electrons which are scattered back from the sample, so called "backscattered electrons" (BSE) 103, may also travel towards the X-ray detector 105. An electron with the same energy as an X-ray photon deposits the same amount of energy in the X-ray detector 105 and therefore gives a similar signal charge. Typically, the number of electrons travelling towards the detector is considerably larger than the number of X-ray photons, and therefore the signal due to electrons represents a large proportion of the measured X-ray spectrum and can overwhelm the contribution due to X-ray photons. The BSE contribution in the spectrum is typically a large background extending over all energies up to the primary beam energy. X-ray analysis may be conducted in principle in any apparatus using an incident beam of charged particles (e.g., electrons or ions) and although the description herein refers to electrons, the same principles apply in any charged particle apparatus.

The X-ray detector is usually isolated from the vacuum of the EM by a thin foil of typically polymer supported on a grid with high transparency. If BSE strike the foil or the grid, they generate X-ray signals characteristic of the materials in the foil or grid and these X-ray signals appear as a spurious contribution to the recorded X-ray spectrum. As a result of the incident beam, the X-ray photons are emitted in all directions and the X-ray detector only detects photons falling within a cone defined by the active area of the sensor within the X-ray detector. The higher the solid angle defined by this cone, the more signal is collected and this is highly desirable. The solid angle can be increased by increasing the active area of the X-ray detector, and so a large sensor and large aperture are beneficial.

The solid angle can also be increased by locating the sensor closer to the sample. However, when the sensor is placed closer to the sample 101, the tube structure of the X-ray detector 105 containing the sensor can collide with the final pole piece 104 of the electron microscope 100. This collision is shown by way of example at point A in FIG. 1.

Therefore, it is desirable to minimize the external diameter of the detector tube (shown at B in FIG. 1) to minimize the distance between the detector face and the sample without colliding with the conical pole piece of the electron microscope.

SUMMARY

In one embodiment, a charged particle filter includes a magnetic deflector having a bore along an axis thereof passing through the magnetic deflector from a sample end to a detector end of the magnetic deflector, and through which bore charged particles pass when in use, the magnetic deflector being formed from two magnets positioned around the bore, with a gap between the two magnets, the two magnets each having a linear central section and two ends, each end forming a curved surface, the curved surface having an aspect ratio defined by a height in a range of between one tenth and ten times the gap between the two magnets, and a width in a range of between one tenth and ten times the gap. The gap between the two magnets can be in a range of between 1 mm and 20 mm, such as a gap in a range of between 4 mm and 10 mm. The curved surface of at least one end of the two magnets can be a conic section. In some embodiments, the curved surface of both ends of each of the two magnets can be a conic section. In certain embodiments, the conic section can have a radius of curvature in a range of between one tenth and ten times the gap between the two magnets, such as a radius of curvature in a range of between one half and two times the gap between the two magnets. In some other embodiments, the curved surface of at least one end of the two magnets can be a trigonometric function. In certain embodiments, the curved surface of both ends of each of the two magnets can be a trigonometric function.

In another embodiment, a charged particle filter includes a magnetic deflector having a bore along an axis thereof passing through the magnetic deflector from a sample end to a detector end of the magnetic deflector, and through which bore charged particles pass when in use, the magnetic deflector being formed from two magnets positioned around the bore, with a gap between the two magnets, the two magnets each having a linear central section and two ends, at least one end forming a slanted surface around the bore. In some embodiments, both ends form a slanted surface around the bore. The slanted surface can have a slope in a range of between 0.1 and 10.0, such as a slope in a range of between 0.5 and 2.0.

In yet another embodiment, a charged particle filter comprising a magnetic deflector having a bore along an axis thereof passing through the magnetic deflector from a sample end to a detector end of the magnetic deflector, and through which bore charged particles pass when in use, the magnetic deflector being formed from two magnets positioned around the bore, with a gap between the two magnets, the two magnets each having a linear central section and two ends, each end forming at least two curved surfaces. The at least two curved surfaces can include a conic section, a trigonometric function, or any combination thereof.

In still another embodiment, a particle analyzer includes a charged particle filter as described above and a particle detector positioned upon the axis facing the detector end of the magnetic deflector.

The invention has many advantages, such as enabling the detector to be located closer to the sample without colliding with the conical pole piece of the electron microscope.

BRIEF DESCRIPTION OF THE DRAWINGS

FIG. 3F is a schematic illustration of a perspective side view of an end of a magnet including a curved surface described by a cosine function of an exemplary charged particle filter.

FIG. 3I is a schematic illustration of a perspective side view of an end of a magnet including a curved surface described by a cubic function of an exemplary charged particle filter.

Like reference numerals refer to corresponding parts throughout the several views of the drawings.

DETAILED DESCRIPTION OF EMBODIMENTS

Figure 1:
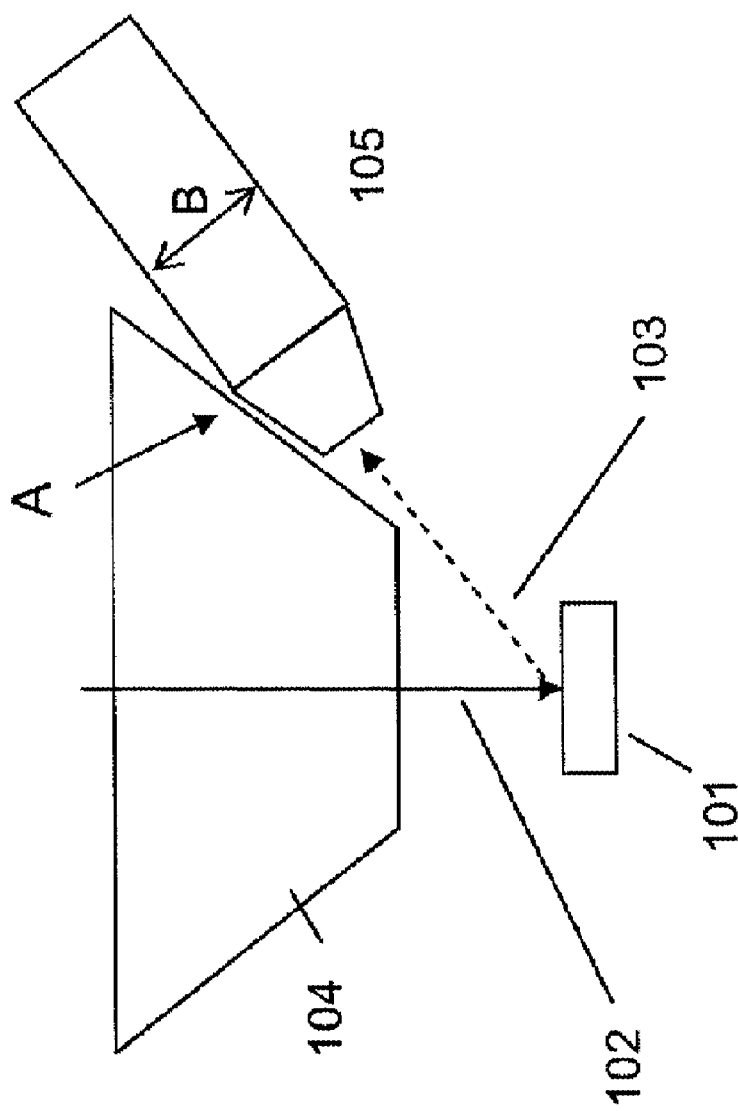
FIG. 1 is a schematic illustration of a prior art arrangement of components in the vicinity of a sample in a scanning electron microscope.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

Figure 2A:
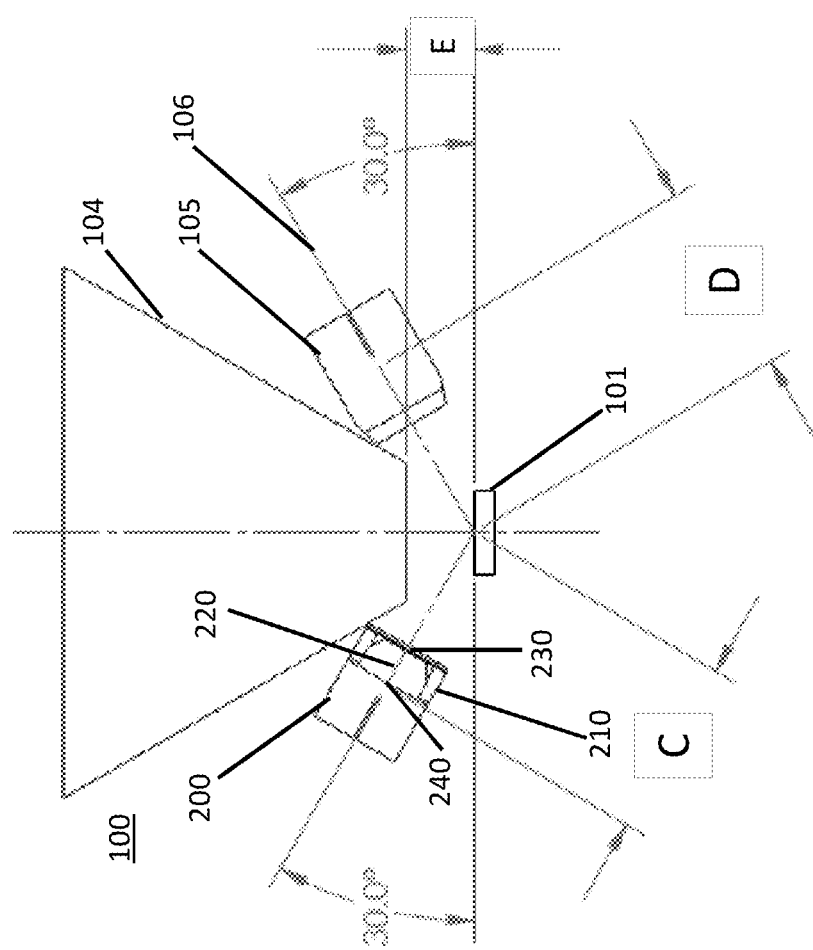
FIG. 2A is a schematic illustration of a side view of an exemplary charged particle filter.

In one embodiment shown in FIG. 2A, a charged particle filter 200 includes a magnetic deflector 210 having a bore 220 along an axis thereof passing through the magnetic deflector 210 from a sample end 230 to a detector end 240 of the magnetic deflector 210, and through which bore 220 charged particles pass when in use in an electron microscope 100. A comparison to an X-ray detector 105 using rectangular magnets is also shown in FIG. 2A. With the axis of the bore 220 at the same angle (30°) with respect to the plane of the sample 101 as the axis of the bore 106, the distance C of detector end 240 of the magnetic deflector 210 to the sample 101 is less than the corresponding distance D of the detector 105 to the plane of the sample 101 at a distance E between the face of the detector 104 and the sample 101 without colliding with the final pole piece 104, which is highly advantageous for the reasons described above.

Figure 2B:
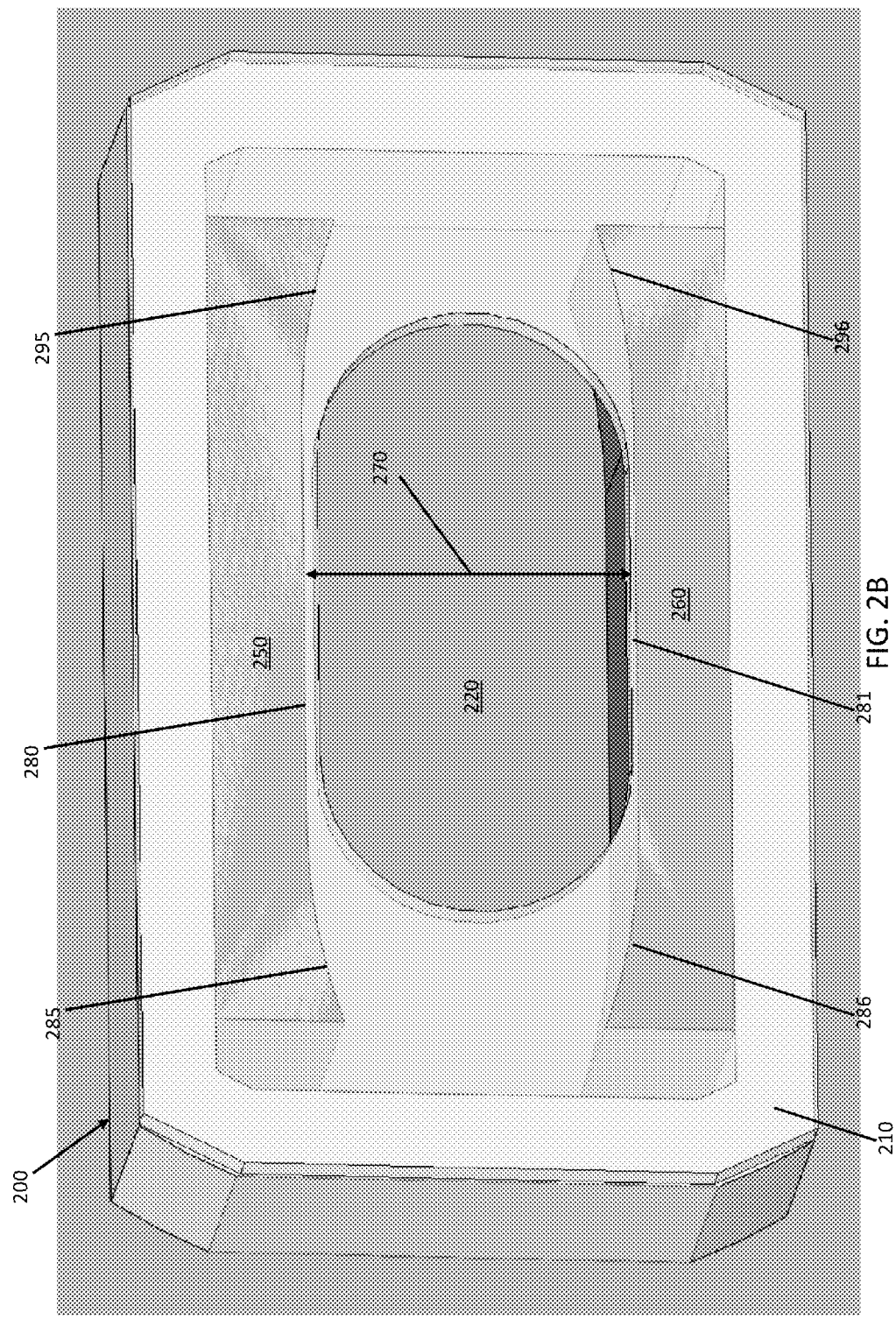
FIG. 2B is a schematic illustration of a perspective front view of an exemplary charged particle filter.

Turning to FIG. 2B, the magnetic deflector 210 of the charged particle filter 200 is formed from two magnets 250 and 260 positioned around the bore 220. In principle, the magnets could be electromagnets, although permanent magnets are considered to be more practical for the present application. A variety of magnetic materials are suitable for the two magnets 250 and 260, such as, for example, sintered neodymium-iron-boron (Nd—Fe—B) with a maximum energy product of 50 MGOe available from, for example, Dexter Magnetic Technology (Elk Grove Village, Ill.).

Turning back to FIG. 2B, the linear sections 280 and 281 of the two magnets 250 and 260, respectively, are located symmetrically with respect to the bore 220 and each have two ends 285, 295, and 286, 296, each end forming a curved surface around the bore 220, with a gap 270 between the two magnets 250 and 260. The linear central sections 280 and 281 are typically oriented parallel to the plane of the sample 101 (see FIG. 2A). The gap 270 between the two magnets 250 and 260 can be in a range of between 1 mm and 20 mm, such as a gap in a range of between 4 mm and 10 mm. In some embodiments, the gap 270 can be a gap of 1.5 mm, 2.0 mm, 2.5 mm, 3.0 mm, 3.5 mm, 4.0 mm, 4.5 mm, 5.0 mm, 5.5 mm, 6.0 mm, 6.5 mm, 7.0 mm, 7.5 mm, 8.0 mm, 8.5 mm, 9.0 mm, 9.5 mm, 10.0 mm, 10.5 mm, 11.0 mm, 11.5 mm, 12.0 mm, 12.5 mm, 13.0 mm, 13.5 mm, 14.0 mm, 14.5 mm, 15.0 mm, 15.5 mm, 16.0 mm, 16.5 mm, 17.0 mm, 17.5 mm, 18.0 mm, 18.5 mm, 19.0 mm, or 19.5 mm. In a specific embodiment, the gap 270 is 6.6 mm.

Figure 3A:
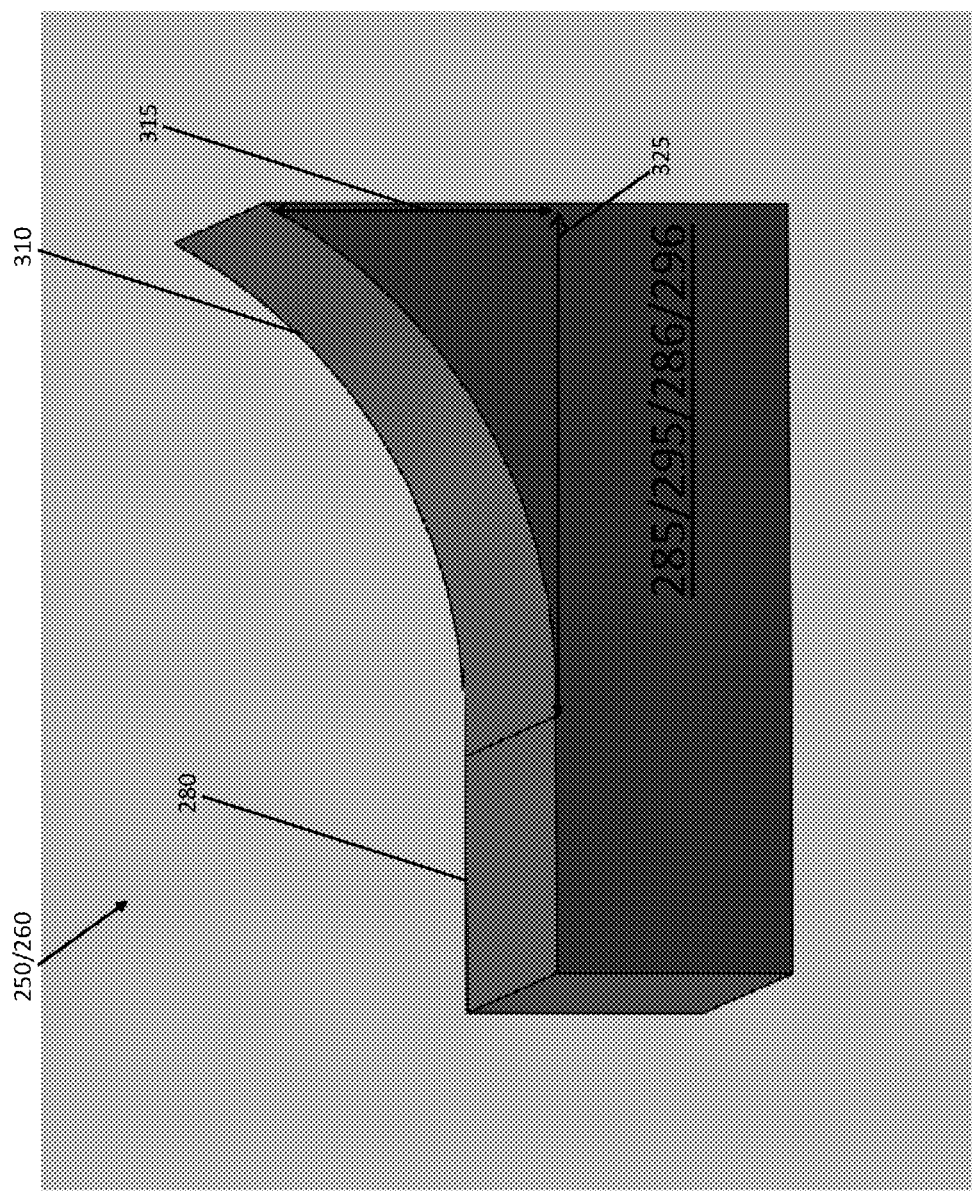
FIG. 3A is a schematic illustration of a perspective side view of an end of a magnet including a cylindrical curved surface of an exemplary charged particle filter.
Figure 3B:
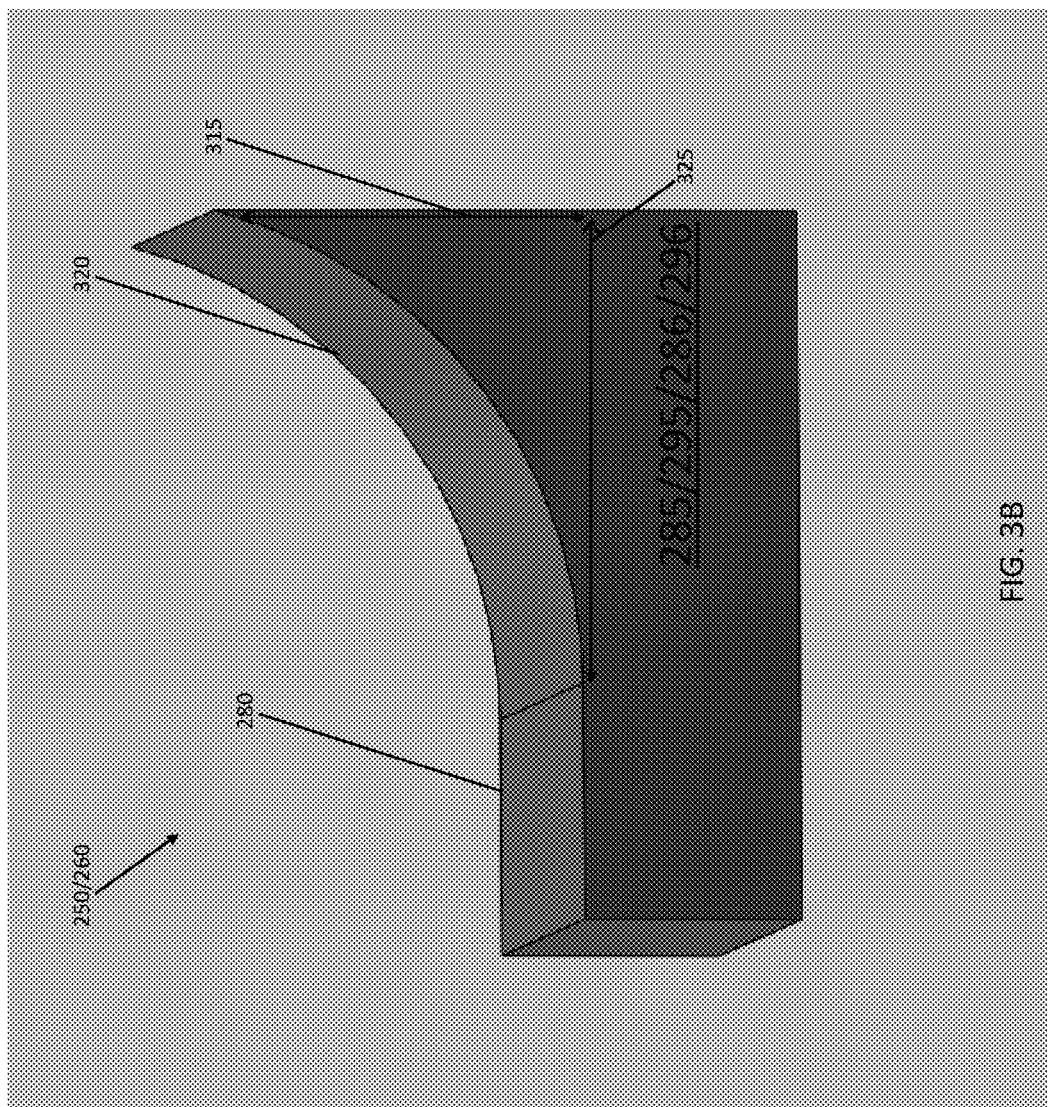
FIG. 3B is a schematic illustration of a perspective side view of an end of a magnet including a elliptical curved surface of an exemplary charged particle filter.
Figure 3C:
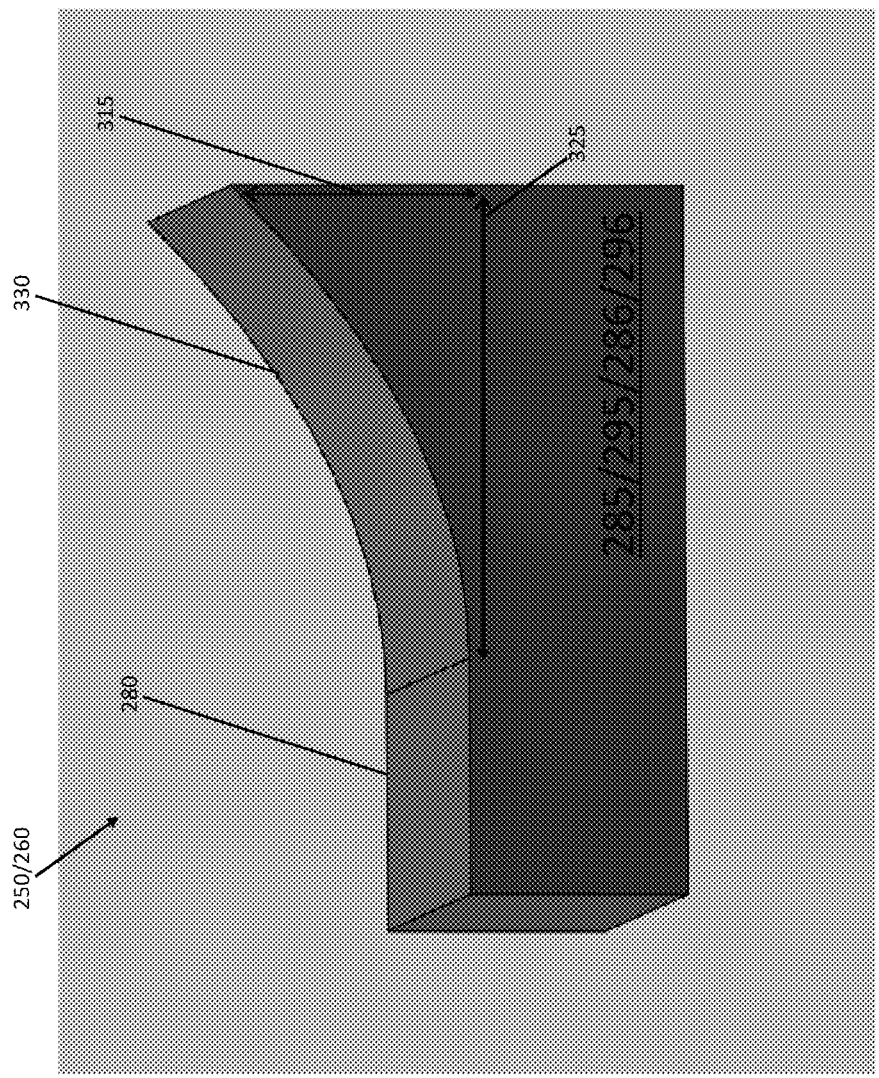
FIG. 3C is a schematic illustration of a perspective side view of an end of a magnet including a parabolic curved surface of an exemplary charged particle filter.
Figure 3D:
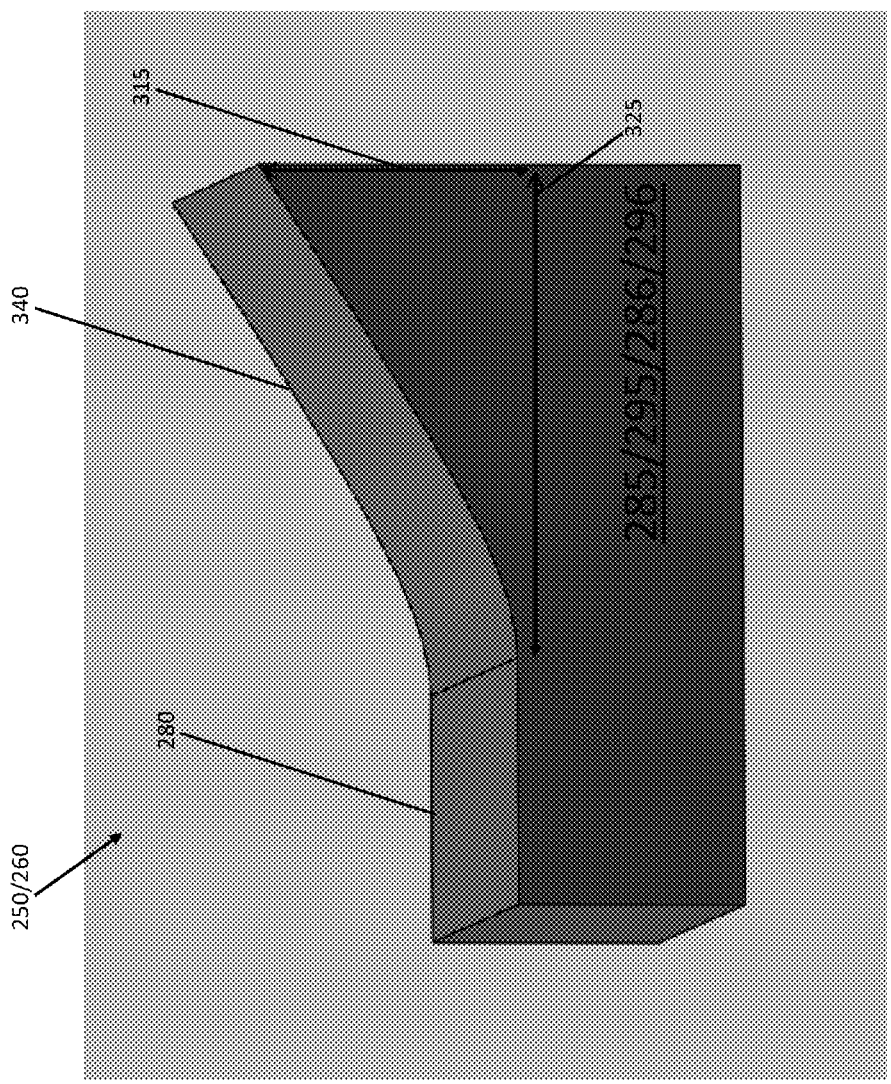
FIG. 3D is a schematic illustration of a perspective side view of an end of a magnet including a hyperbolic curved surface of an exemplary charged particle filter.

A plurality of shapes and combinations of shapes are suitable for the curved surfaces of the ends 285, 295, and 286, 296 of the two magnets 250 and 260, respectively. In the description of the curved surfaces and associated figures described below, when one end of a magnet is shown for clarity, the other end of the magnet can be formed from any one of the curved surfaces described herein, and the four ends 285, 295, and 286, 296 can be formed from different curved surfaces from one another, unless otherwise specified. As shown in FIG. 3A, the curved surface 310 has an aspect ratio defined by a height 315 in a range of between one tenth and ten times the gap 270 (shown in FIG. 2B) between the two magnets 250 and 260, and a width 325 in a range of between one tenth and ten times the gap 270. In some embodiments, the curved surface of one end 285, 295, or 286, 296 of each of the two magnets 250 and 260, respectively, is a conic section, such as a cylindrical curved surface 310, as shown in FIG. 3A, an elliptical curved surface 320, as shown in FIG. 3B, a parabolic curved surface 330, as shown in FIG. 3C, or a hyperbolic curved surface 340, as shown in FIG. 3D. The curved surfaces can be tangent to the linear central section 280, as shown in FIGS. 3A-3D, or offset from the linear central section (not shown). In some embodiments, the curved surface of both ends 285, 295, and 286, 296 of each of the two magnets 250 and 260, respectively, can be a conic section as described above.

Figure 3E:
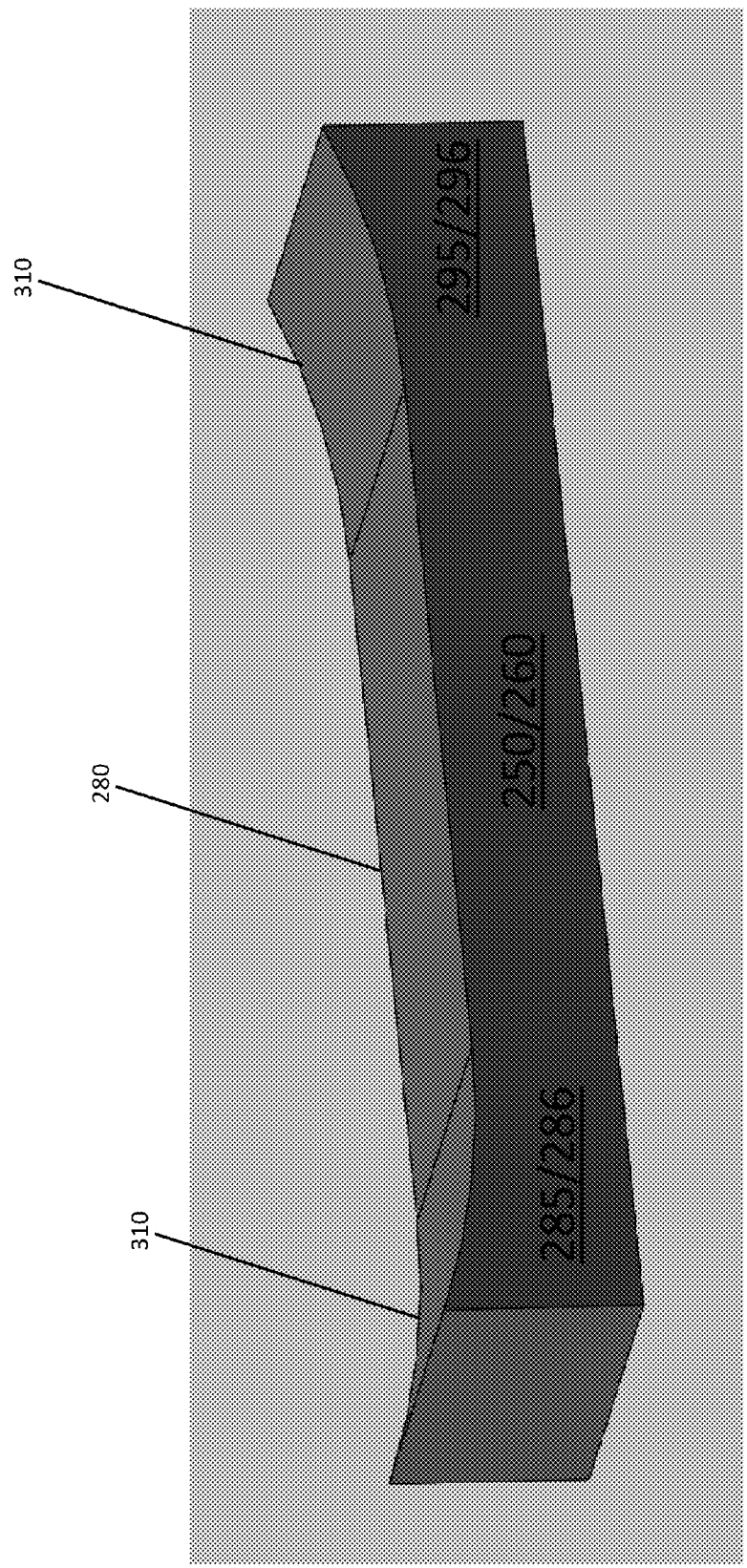
FIG. 3E is a schematic illustration of a perspective side view of a magnet including symmetrical cylindrical curved surfaces of an exemplary charged particle filter.

In certain embodiments, the cylindrical curved surface 310 has a radius of curvature in a range of between one tenth and ten times the gap 270 between the two magnets 250 and 260, such as a radius of curvature in a range of between one half and two times the gap 270 between the two magnets 250 and 260. In the specific embodiment described above, the cylindrical curved surface 310 of both ends 285 and 295 has a radius of curvature of 12 mm, as shown in FIG. 3E (and a corresponding gap of 6.6 mm as described above).

Figure 3G:
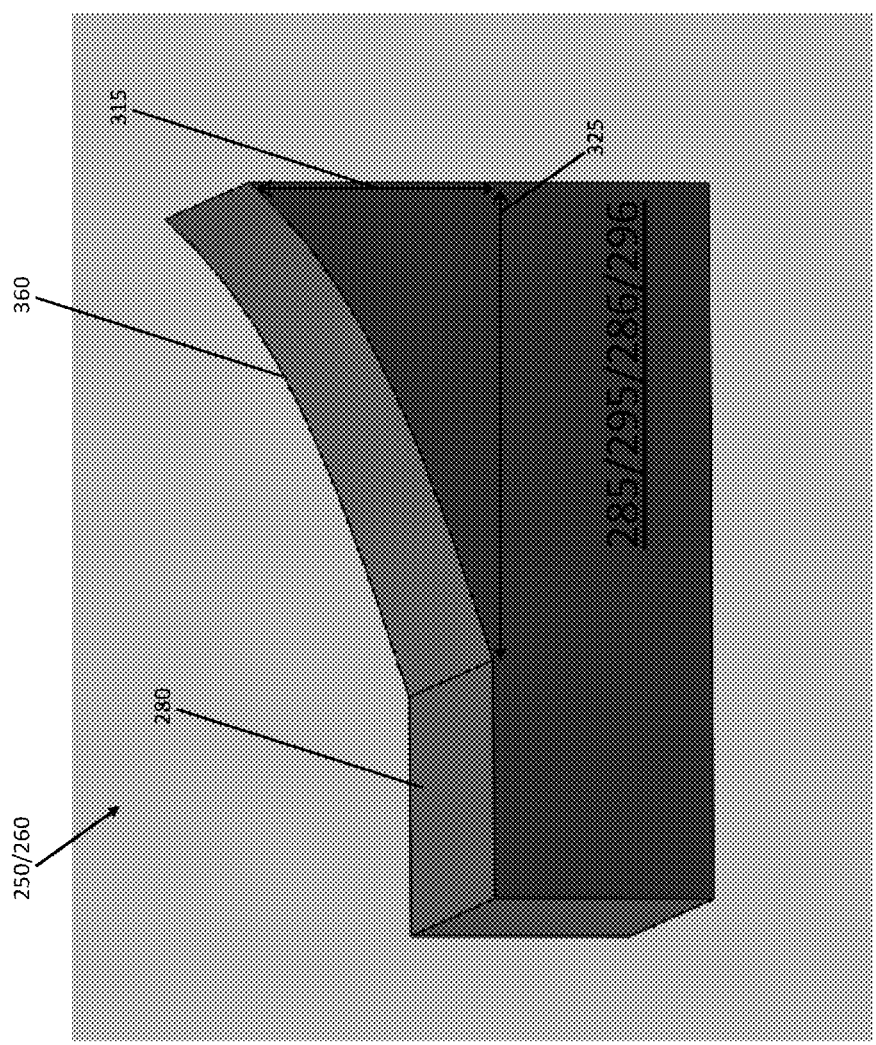
FIG. 3G is a schematic illustration of a perspective side view of an end of a magnet including a curved surface described by a tangent function of an exemplary charged particle filter.
Figure 3H:
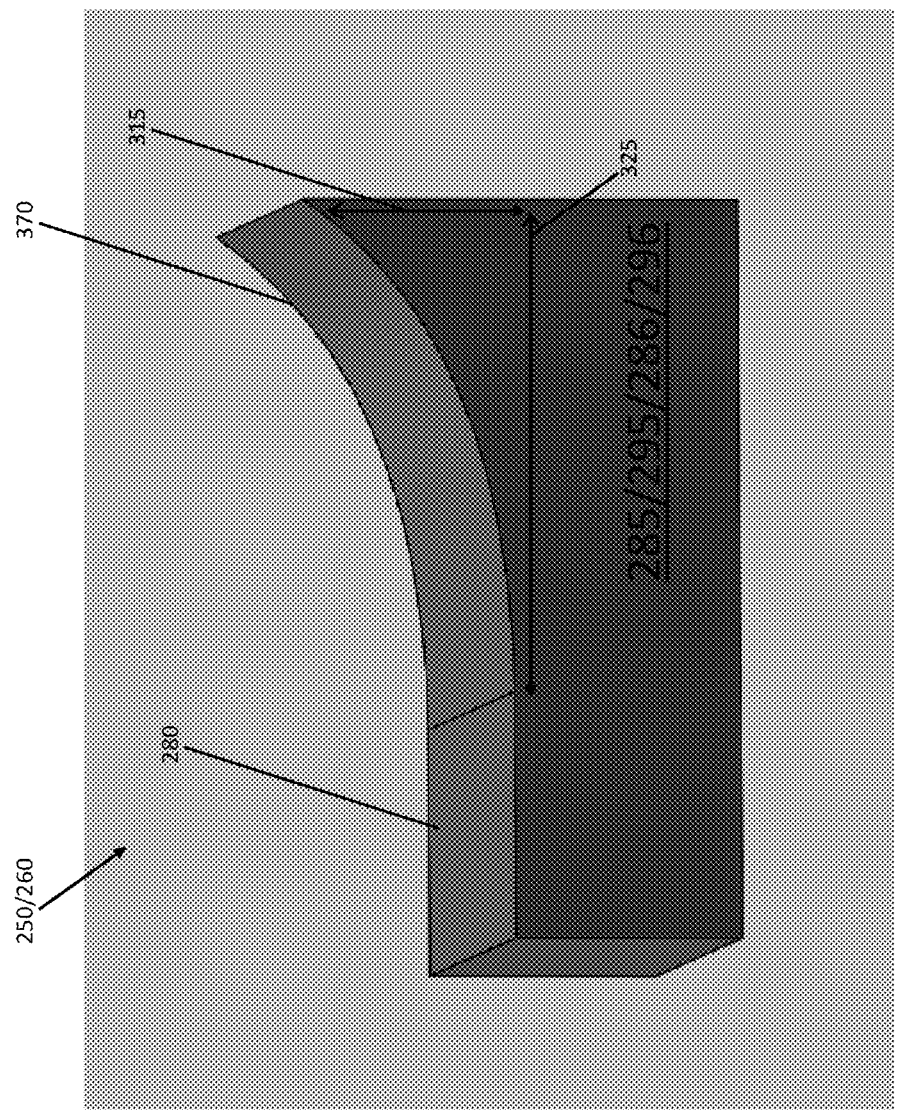
FIG. 3H is a schematic illustration of a perspective side view of an end of a magnet including a curved surface described by a secant function of an exemplary charged particle filter.
Figure 31:
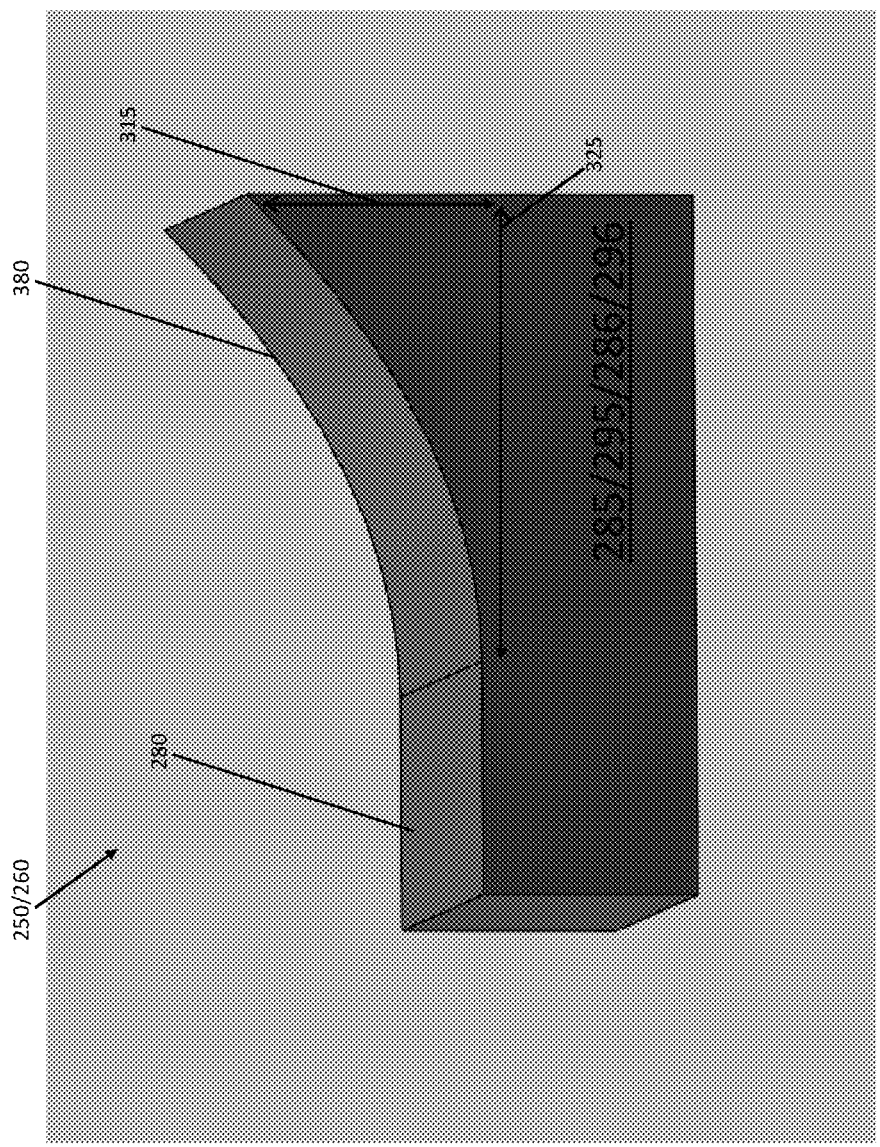
Figure 3J:
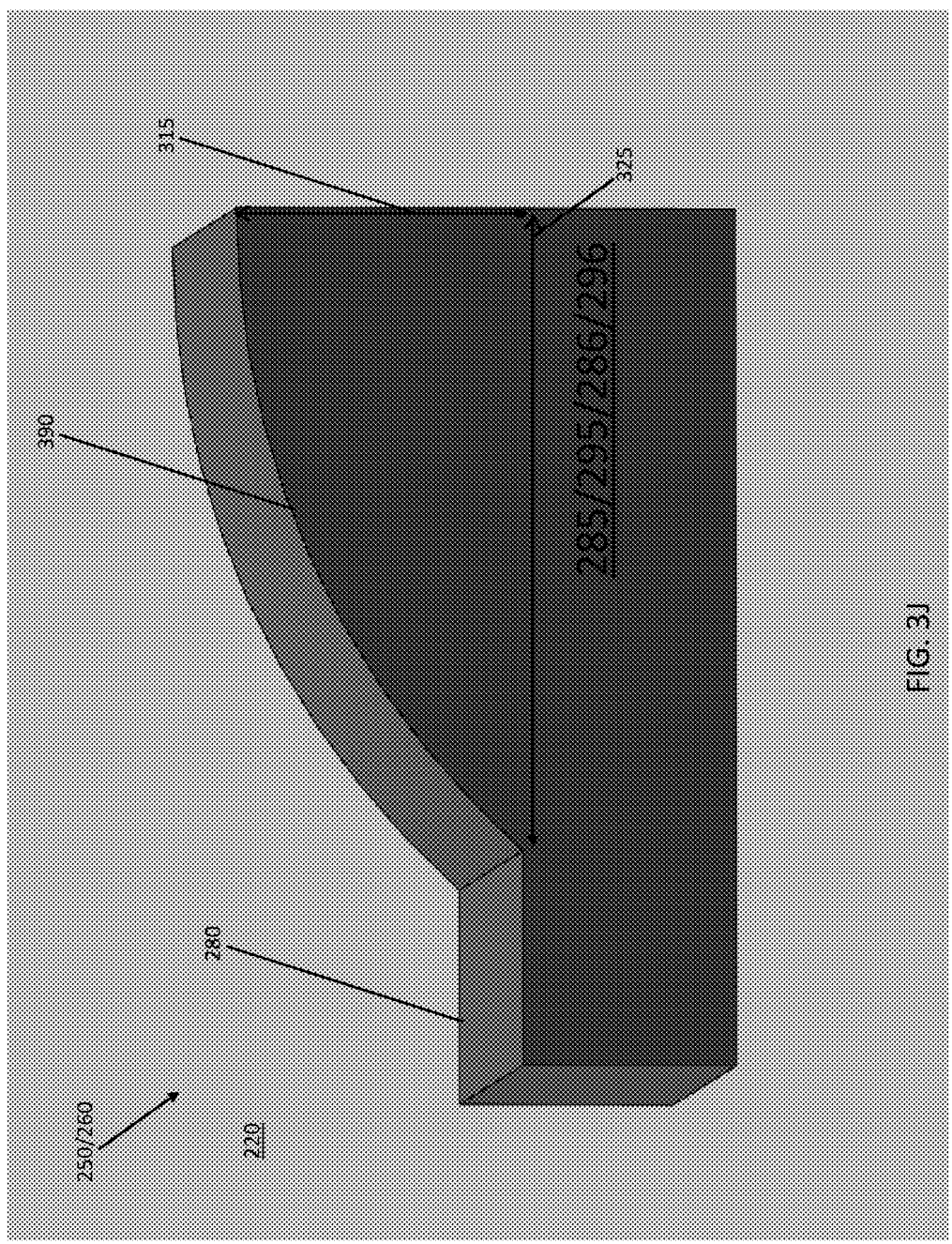
FIG. 3J is a schematic illustration of a perspective side view of an end of a magnet including a curved surface that is convex with respect to the bore of an exemplary charged particle filter.

In certain embodiments, the curved surface of one end 285, 295, or 286, 296 of the two magnets 250 and 260, respectively, is described by a trigonometric function, such as a curved surface 350 described by a cosine function, as shown in FIG. 3F, a curved surface 360 described by a tangent function, as shown in FIG. 3G, a curved surface 370 described by a secant function, as shown in FIG. 3H, and their respective inverse functions (sine, cotangent, cosecant). In some embodiments, the curved surface of both ends 285, 295, and 286, 296 of the two magnets 250 and 260, respectively, is described by a trigonometric function as described above. In some other embodiments, as shown in FIG. 3I, the curved surface 380 of one or both ends 285, 295, and 286, 296 of the two magnets 250 and 260, respectively, is described by a cubic function. In certain embodiments, the curved surface of one or both ends is described by a sum of two or more functions, such as a Fourier series of sine and cosine functions, or a power series function ($ax+bx^2+cx^3+\ldots$). In another embodiment, shown in FIG. 3J, a curved surface 390 is convex with respect to the bore 220.

Figure 4:
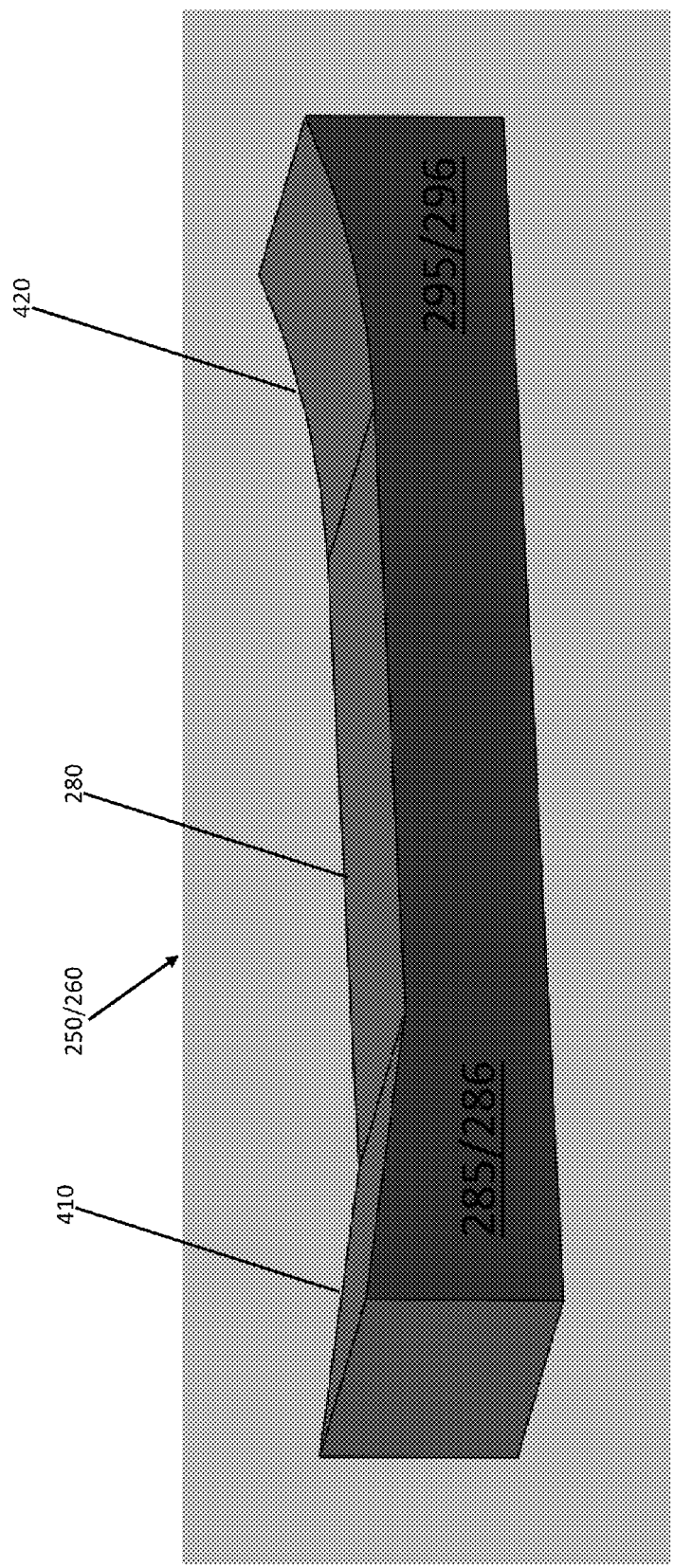
FIG. 4 is a schematic illustration of a perspective side view of a magnet including asymmetrical curved surfaces of an exemplary charged particle filter.

In some embodiments, as shown in FIG. 4, the curved surface 410 of one end 285, 286 of each of the two magnets 250 and 260, respectively, is described by a different function from the curved surface 420 of the other end 295, 296 of each of the two magnets 250 and 260, respectively. The two curved surfaces 410 and 420 can be described by any combination of the curved surfaces described above.

Figure 5:
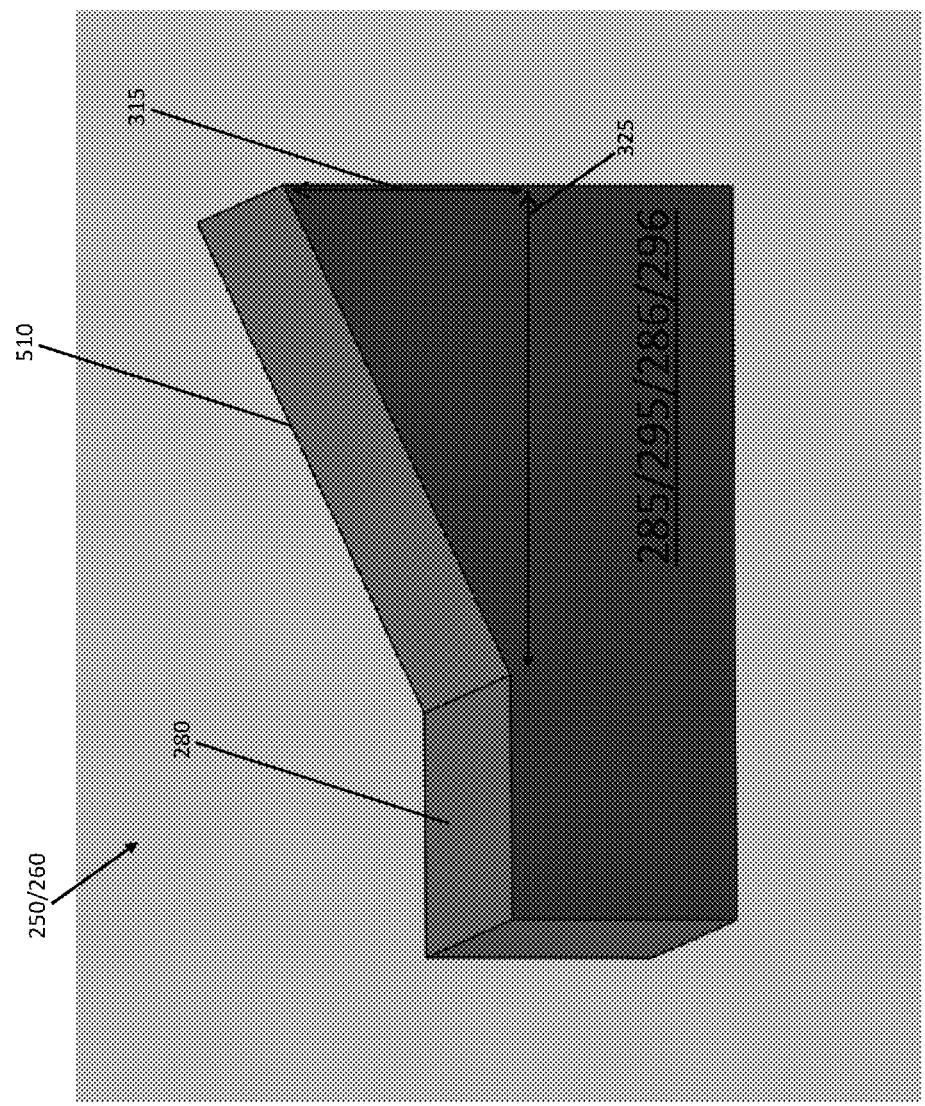
FIG. 5 is a schematic illustration of a perspective side view of an end of a magnet including a slanted surface of an exemplary charged particle filter.

The surfaces of the ends of the two magnets forming the magnetic deflector can be formed from a plurality of surfaces. In another embodiment, a charged particle filter includes a magnetic deflector as described above, except that each of the two magnets 250 and 260 have one end 285, 296 or 286, 296, as shown in FIG. 5, that forms a slanted surface 510 around the bore. In some embodiments, both ends 285, 295, and 286, 296 form a slanted surface 510 around the bore. The slanted surface 510 can have a slope in a range of between 0.1 and 10.0, such as a slope in a range of between 0.5 and 2.0. In some embodiments, the slanted surface 510 can have a slope of 0.1, 0.2, 0.3, 0.4, 0.5, 1.0, 1.5, 2.0, 2.5, 3.0, 3.5, 4.0, 4.5, 5.0, 5.5, 6.0, 6.5, 7.0, 7.5, 8.0, 8.5, 9.0, 9.5, or 10.0.

Figure 6:
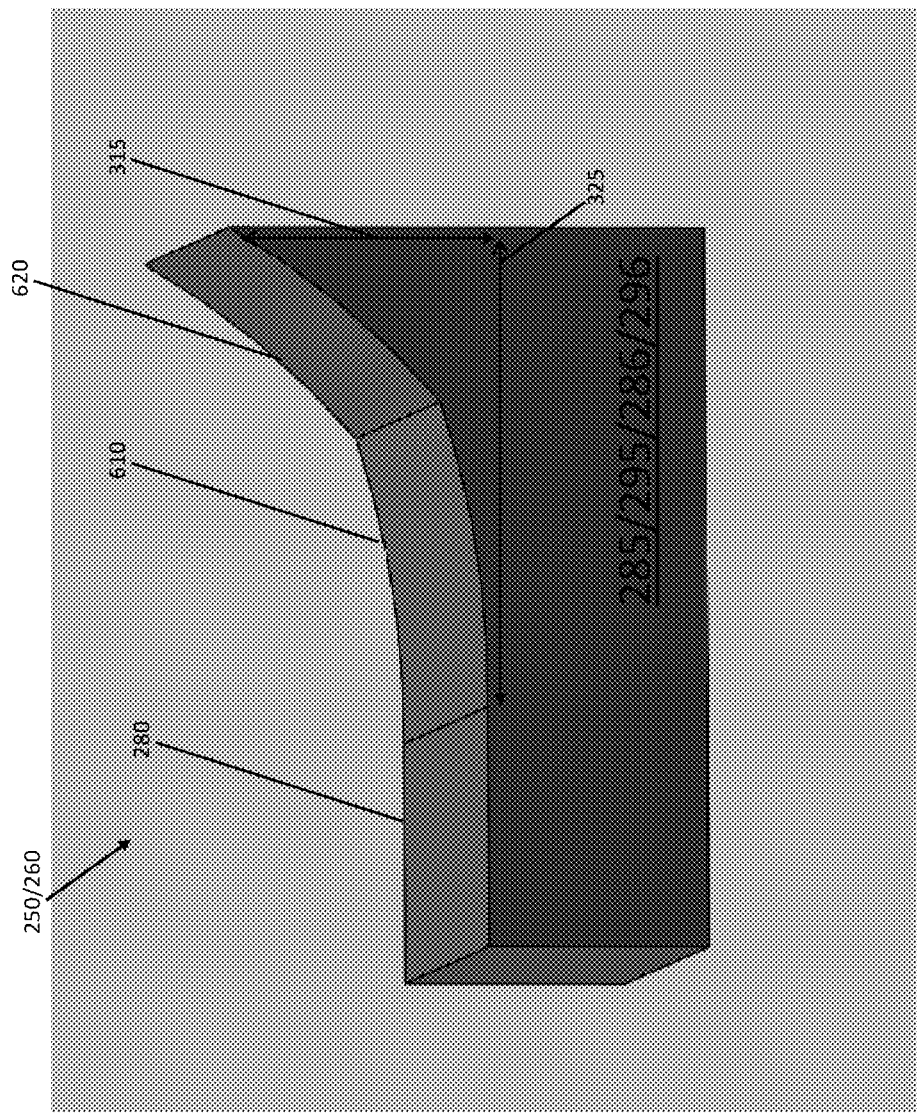
FIG. 6 is a schematic illustration of a perspective side view of an end of a magnet including two curved surfaces of an exemplary charged particle filter.

In yet another embodiment, a charged particle filter includes a magnetic deflector as described above, except that each of the two magnets 250 and 260 have one end 285, 295, or 286, 296, as shown in FIG. 6, that forms two curved surfaces 610 and 620 around the bore. The two curved surfaces 610 and 620 can include a conic section, a trigonometric function, or any combination of curved surfaces described above. Curved surfaces including more than two curved surface segments, and including slanted surface segments as described above, are also suitable.

Figure 7:
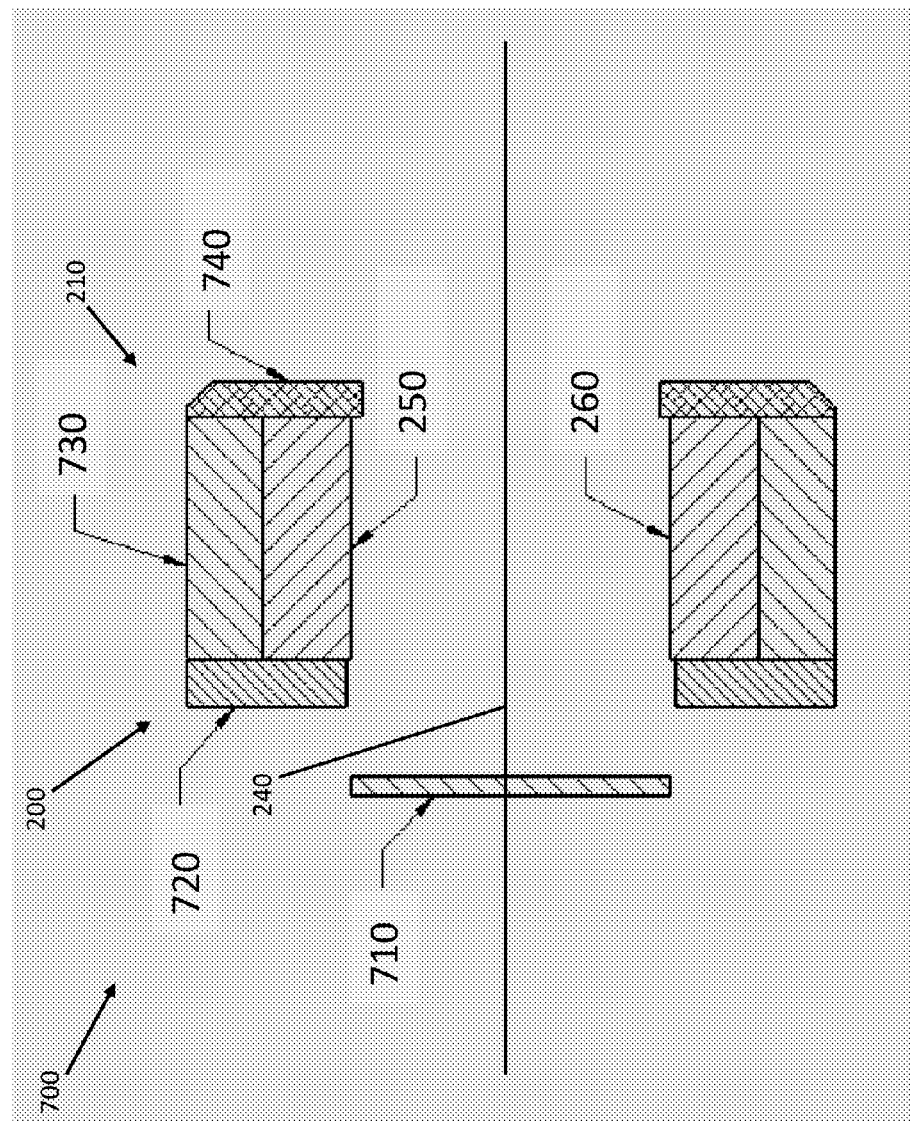
FIG. 7 is a schematic illustration of a side view of an exemplary particle analyzer.

In still another embodiment shown in FIG. 7, a particle analyzer 700 includes a charged particle filter 200 as described above and a particle detector 710 positioned upon the axis facing the detector end 240 of the magnetic deflector 210. The particle analyzer 700 further includes a housing 720, a flux return 730, and a collimator 740. A variety of X-ray detectors are suitable for the particle detector 710, available from, for example, PN Detector (Munich, Germany).

OTHER EMBODIMENTS

A number of embodiments have been described. Nevertheless, it will be understood that various modifications may be made without departing from the spirit and scope of the disclosure. Accordingly, other embodiments are within the scope of the following claims.

What is claimed is:

1. A charged particle filter comprising a magnetic deflector having a bore along an axis thereof passing through the magnetic deflector from a sample end to a detector end of the magnetic deflector, and through which bore charged particles pass when in use, the magnetic deflector being formed from two magnets positioned around the bore, with a gap between the two magnets, the two magnets each having a linear central section and two ends, each end comprising a surface having an aspect ratio defined by a height in a range of between one tenth and ten times the gap between the two magnets, and a width in a range of between one tenth and ten times the gap.

2. The charged particle filter of claim 1, wherein the surface comprises a curved surface.

3. The charged particle filter of claim 2, wherein the curved surface of at least one end of each of the two magnets is a conic section.

4. The charged particle filter of claim 3, wherein the conic section has a radius of curvature in a range of between one tenth and ten times the gap between the two magnets.

5. The charged particle filter of claim 4, wherein the conic section has a radius of curvature in a range of between one half and two times the gap between the two magnets.

6. The charged particle filter of claim 3, wherein the curved surface of both ends of each of the two magnets is a conic section.

7. The charged particle filter of claim 6, wherein the conic section has a radius of curvature in a range of between one tenth and ten times the gap between the two magnets.

8. The charged particle filter of claim 7, wherein the conic section has a radius of curvature in a range of between one half and two times the gap between the two magnets.

9. The charged particle filter of claim 2, wherein the curved surface of at least one end of each of the two magnets is a trigonometric function.

10. The charged particle filter of claim 9, wherein the curved surface of both ends of each of the two magnets is a trigonometric function.

11. The charged particle filter of claim 2, wherein the gap between the two magnets is in a range of between 1 mm and 20 mm.

12. The charged particle filter of claim 11, wherein the gap between the two magnets is in a range of between 4 mm and 10 mm.

13. The charged particle filter of claim 1, wherein the surface comprises a slanted surface.

14. The charged particle filter of claim 13, wherein the slanted surface has a slope in a range of between 0.1 and 10.0.

15. The charged particle filter of claim 14, wherein the slanted surface has a slope in a range of between 0.5 and 2.0.

16. The charged particle filter of claim 13, wherein both ends form a slanted surface around the bore.

17. The charged particle filter of claim 13, wherein the slanted surface has a slope in a range of between 0.1 and 10.0.

18. The charged particle filter of claim 17, wherein the slanted surface has a slope in a range of between 0.5 and 2.0.

19. A particle analyzer comprising:
a charged particle filter including a magnetic deflector having a bore along an axis thereof passing through the magnetic deflector from a sample end to a detector end of the magnetic deflector, and through which bore charged particles pass when in use, the magnetic deflector being formed from two magnets positioned around the bore, with a gap between the two magnets, the two magnets each having a linear central section and two ends, each end comprising a surface having an aspect ratio defined by a height in a range of between one tenth and ten times the gap between the two magnets, and a width in a range of between one tenth and ten times the gap; and
a particle detector positioned upon the axis facing the detector end of the magnetic deflector.

20. The particle analyzer of claim 19, wherein the surface comprises a curved surface.

21. The particle analyzer of claim 20, wherein the curved surface of at least one end of the two magnets is a conic section.

22. The particle analyzer of claim 21, wherein the conic section has a radius of curvature in a range of between one tenth and ten times the gap between the two magnets.

23. The particle analyzer of claim 22, wherein the conic section has a radius of curvature in a range of between one half and two times the gap between the two magnets.

24. The particle analyzer of claim 21, wherein the curved surface of both ends of at least one of the two magnets is a conic section.

25. The particle analyzer of claim 24, wherein the conic section has a radius of curvature in a range of between one tenth and ten times the gap between the two magnets.

26. The particle analyzer of claim 25, wherein the conic section has a radius of curvature in a range of between one half and two times the gap between the two magnets.

27. The particle analyzer of claim 20, wherein the curved surface of at least one end of the two magnets is a trigonometric function.

28. The particle analyzer of claim 27, wherein the curved surface of both ends of each of the two magnets is a trigonometric function.

29. The particle analyzer of claim 20, wherein the gap between the two magnets is in a range of between 1 mm and 20 mm.

30. The particle analyzer of claim 29, wherein the gap between the two magnets is in a range of between 4 mm and 10 mm.

* * * * *